(12) United States Patent
Xie et al.

(10) Patent No.: US 12,080,606 B2
(45) Date of Patent: Sep. 3, 2024

(54) SEMICONDUCTOR MANUFACTURING METHOD

(71) Applicant: WUHAN XINXIN SEMICONDUCTOR MANUFACTURING CO., LTD., Hubei (CN)

(72) Inventors: Yan Xie, Hubei (CN); Xuanjun Liu, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 434 days.

(21) Appl. No.: 17/646,661

(22) Filed: Dec. 30, 2021

(65) Prior Publication Data

US 2023/0162987 A1 May 25, 2023

(30) Foreign Application Priority Data

Nov. 23, 2021 (CN) .......................... 202111397145.6

(51) Int. Cl.
| | |
|---|---|
| *H01L 21/8234* | (2006.01) |
| *H01L 21/033* | (2006.01) |
| *H01L 21/3065* | (2006.01) |
| *H01L 21/308* | (2006.01) |
| *H01L 21/311* | (2006.01) |
| *H01L 21/762* | (2006.01) |

(52) U.S. Cl.
CPC .. *H01L 21/823481* (2013.01); *H01L 21/0337* (2013.01); *H01L 21/3065* (2013.01); *H01L 21/308* (2013.01); *H01L 21/31116* (2013.01); *H01L 21/31144* (2013.01); *H01L 21/76224* (2013.01); *H01L 21/76283* (2013.01)

(58) Field of Classification Search
None
See application file for complete search history.

(56) References Cited

U.S. PATENT DOCUMENTS

2015/0318173 A1* 11/2015 Shih .................... H01L 21/0228
438/702

\* cited by examiner

*Primary Examiner* — Feifei Yeung Lopez
(74) *Attorney, Agent, or Firm* — Muncy, Geissler, Olds & Lowe, P.C.

(57) ABSTRACT

The present application provides a method for manufacturing a semiconductor, comprising providing a substrate, on which a first, second and third dielectric layers are successively formed, the third dielectric layer having an initial opening; forming a first deposited layer which at least covers a side wall of the initial opening to form a first mask layer having a first opening; removing the second dielectric layer directly below the first opening to expose a side wall of the second dielectric layer; forming a second deposited layer which at least covers the side wall of the first opening and the exposed side wall of the second dielectric layer, to form a second mask layer having a second opening; removing the first dielectric layer directly below the second opening to expose the substrate; and removing the second mask layer, and forming a trench by etching the substrate.

16 Claims, 5 Drawing Sheets

SEMICONDUCTOR MANUFACTURING METHOD

CROSS-REFERENCE TO RELATED APPLICATION

This application claims the priority of Chinese patent application number 202111397145.6, filed on Nov. 23, 2021, the entire contents of which are incorporated herein by reference.

TECHNICAL FIELD

The present application relates to the field of integrated circuit manufacture, and more particular, to a semiconductor manufacturing method.

BACKGROUND

Image sensors are widely used in digital still cameras, cellular phones, security cameras, medical field, automobile, and other applications. Driven by the increasing demands for higher resolution, lower power consumption, wider dynamic range and the like, architectures for devices containing image sensors have continuously developed with great speed. These demands also accelerate the further miniaturization and integration of image sensors in such devices.

An image sensor includes a plurality of photosensitive elements. When the lights of images from an external scene is incident on the image sensor, each of the photosensitive elements absorb part of the incident lights of images. After the absorption of the lights of images, respective photosensitive elements (e.g., photodiodes) of the image sensor generate image charge. The amount of image charge generated is proportional to the lights of images's intensity. The generated image charge may be used to represent the image of the external scene.

For the image sensor, a deep trench isolation (DTI) is provided between photosensitive elements to avoid crosstalk between adjacent photosensitive elements and improve electronic isolation of the image sensor, so as to improve imaging quality. The process for a smaller dimension of the deep trench isolation (DTI) is able to improve imaging quality of the image sensor as well as forming more photosensitive elements within the same area to raise the pixel per inch. Moreover, the miniaturization demand of the image sensor also results in an reduced distance between adjacent photosensitive elements, which leads to an urgent demand for the small dimension of the deep trench isolation (DTI).

However, the formation of the deep trench isolation (DTI) with a small dimension, i.e., the deep trench isolation (DTI) with an reduced critical dimension (CD), requires the use of more expensive photoresist and more accurate process control, which may lead to a significant increase in cost. Therefore, there is a need to provide a more suitable manufacturing method.

SUMMARY

It is an object of present application to manufacture a semiconductor device with an reduced dimension of deep trench isolation (DTI) structure at a low cost, which enables to offer the semiconductor device an improved imaging quality.

The present application provides a method for manufacturing a semiconductor, comprising:

providing a substrate, on which a first dielectric layer, a second dielectric layer and a third dielectric layer are successively formed, the third dielectric layer having an initial opening;

forming a first deposited layer which at least covers a surface of a side wall of the initial opening, to form a first mask layer having a first opening;

removing the second dielectric layer directly below the first opening to expose a side wall of the second dielectric layer by performing a first etching procedure with the first mask layer as a mask;

forming a second deposited layer which at least covers the side wall of the first opening and the exposed side wall of the second dielectric layer, to form a second mask layer having a second opening;

removing the first dielectric layer directly below the second opening to expose the substrate by performing a second etching procedure with the second mask layer as a mask, thereby transferring the second opening into the etched first dielectric layer; and removing the second mask layer, and forming a trench by etching the substrate with the first dielectric layer having the second opening as a mask.

Further, forming the first mask layer, performing the first etching procedure, forming the second mask layer and performing the second etching procedure are each accomplished within a same etching device.

Further, the first deposited layer is formed by using a deposition gas containing $C_4F_8$ at a source power of 800-1200 W, a bias voltage of 250-400 V and a flow rate of the deposition gas of 100-500 sccm.

Further, a thickness of the first deposited layer formed on the side wall of the initial opening is greater than or equal to 200 nm.

Further, the second dielectric layer directly below the first opening is removed by using an etching gas containing $CF_4$ at a source power of 600-800 W and a bias voltage of 250-400 V.

Further, the second deposited layer is formed by using a deposition gas containing $C_4F_8$ at a source power of 800-1200 W, a bias voltage of 250-400 V and a flow rate of the deposition gas of 200-600 sccm.

Further, the first dielectric layer directly below the second opening is removed by using an etching gas containing CO, $O_2$ and $Ar_2$ at a source power of 800-1500 W and a bias voltage of 200-400 V.

Further, removing the second mask layer comprises removing the second deposited layer, the first deposited layer and the third dielectric layer by $O_2$ plasma ashing or stripping solution immersion and removing the second dielectric layer by a wet etching process using an oxalic acid solution.

Further, etching the substrate comprises alternatively performing an etching procedure and a passivation procedure, wherein the etching procedure is performed with an etch gas containing $SF_6$ and the passivation procedure is performed with a passivation gas containing $C_4F_8$.

Further, the passivation procedure is performed with the passivation gas containing $C_4F_8$ for a period of passivation time of 10-30 s at a source power of 450-600 W, a $C_4F_8$ flow rate of 10-20 sccm, a pressure of 3-10 mTorr, a temperature of 30-50° C. and a bias voltage of 60-100 V, and the etching procedure is performed with the etching gas containing $SF_6$ for a period of etching time of 30-50 s at a source power of 300-400 W, an $SF_6$ flow rate of 30-50 sccm, a pressure of 3-10 mTorr and a temperature of 30-50° C.

Further, the first dielectric layer is a bottom anti-reflective coating layer, the second dielectric layer being a low temperature oxide layer, the third dielectric layer being a photoresist layer.

Compared to prior art, present application offers the following advantages:

The semiconductor fabrication method provided in present application comprises: providing a substrate, on which a first dielectric layer, a second dielectric layer and a third dielectric layer are successively formed, the third dielectric layer having an initial opening; forming a first deposited layer which at least covers a surface of a side wall of the initial opening, to form a first mask layer having a first opening; removing the second dielectric layer directly below the first opening to expose a side wall of the second dielectric layer by performing a first etching procedure with the first mask layer as a mask; forming a second deposited layer which at least covers the side wall of the first opening and the exposed side wall of the second dielectric layer, to form a second mask layer having a second opening; removing the first dielectric layer directly below the second opening to expose the substrate by performing a second etching procedure with the second mask layer as a mask, thereby transferring the second opening into the etched first dielectric layer; and removing the second mask layer, and forming a trench by etching the substrate with the first dielectric layer having the second opening as a mask.

Present application allows separating the deposition procedure from the etching procedure as well as forming the first deposited layer to narrow the width of the second dielectric layer to be etched and forming the second deposited layer to narrow the width of the first dielectric layer. Such step-wise reduction in width to be etched enables to narrow the critical dimension (CD) of the final trench. That is, by simply adding two deposited layers on the three-layered structure consisted of the first, second dielectric and third dielectric layers using the deposition procedure, the critical dimension (CD) of the trench is able to be effectively narrowed. In this way, the deep trench isolation (DTI) with a reduced dimension is able to be formed at a low cost, which enables to form more photosensitive elements and hence more pixels within the same area, thereby allowing to improve the pixel per inch and thus improve the imaging quality.

In the figures,
11—substrate, 12—oxide layer; 13—first dielectric layer; 14—second dielectric layer; 15—third dielectric layer; 16—first deposited layer; 17—second deposited layer, $K_0$—initial opening; $K_1$—first opening; $K_2$—second opening; and V—trench.

DETAILED DESCRIPTION

In view of the above, embodiments of present application provide a method for manufacturing a semiconductor. The present application will be described in greater detail below by way of particular embodiments with reference to the accompanying drawings. Advantages and features of the present application will become more apparent from the following description. It should be noted that the accompanying drawings are presented in a very simplified form and not necessarily presented to scale, with the only intention to facilitate convenience and clarity in explaining the object of the present invention.

Figure 1:
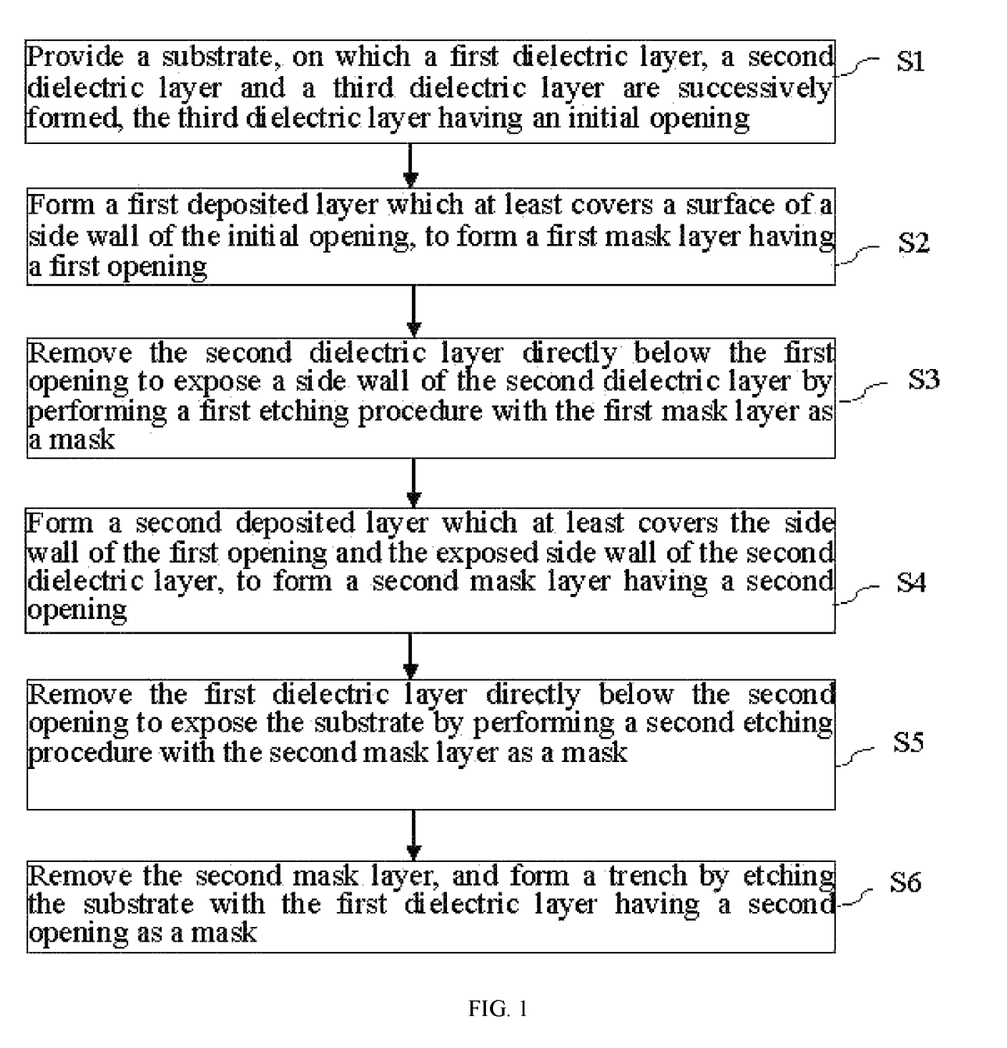
FIG. 1 is a flowchart of the method for manufacturing a semiconductor according to an embodiment of present application.

As shown in FIG. 1, embodiments of present application provide a method for manufacturing a semiconductor, comprising:

(S1) providing a substrate, on which a first dielectric layer, a second dielectric layer and a third dielectric layer are successively formed, the third dielectric layer having an initial opening;

(S2) forming a first deposited layer which at least covers a surface of a side wall of the initial opening, to form a first mask layer having a first opening;

(S3) removing the second dielectric layer directly below the first opening to expose a side wall of the second dielectric layer by performing a first etching procedure with the first mask layer as a mask;

(S4) forming a second deposited layer which at least covers the side wall of the first opening and the exposed side wall of the second dielectric layer, to form a second mask layer having a second opening;

(S5) removing the first dielectric layer directly below the second opening to expose the substrate and to form a second opening in the first dielectric layer by performing a second etching procedure with the second mask layer as a mask, thereby transferring the second opening into the etched first dielectric layer; and (S6) removing the second mask layer, and forming a trench by etching the substrate with the first dielectric layer having the second opening as a mask.

These steps in the method for manufacturing a semiconductor according to embodiments of the present application will be described in greater detail with reference to FIGS. 2 to 9.

Figure 2:
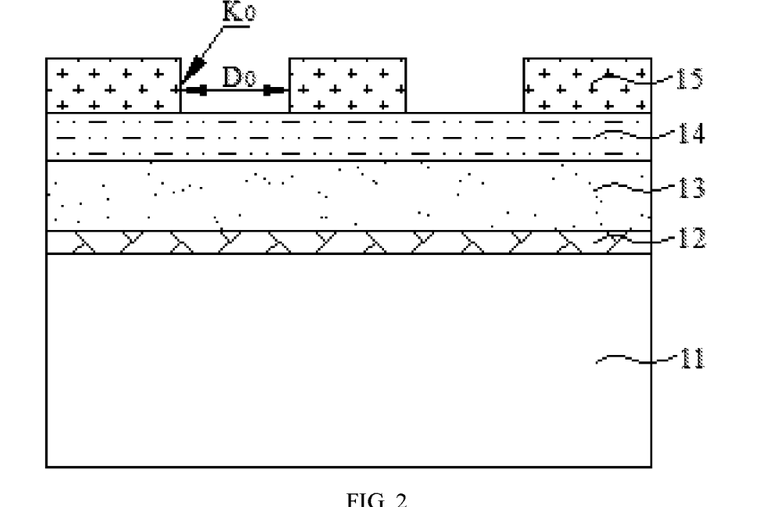
FIG. 2 is a schematic illustration of the method according to an embodiment of present application after the third dielectric layer is formed.

As shown in FIG. 2, in step S1, the substrate 11 is provided. An oxide layer 12 may have been formed on the substrate 11. On the oxide layer 12, the first dielectric layer 13, the second dielectric layer 14 and the third dielectric layer 15 are successively formed. The third dielectric layer 15 has an initial opening $K_0$. The initial opening $K_0$ expose the second dielectric layer 14. The number of the initial openings $K_0$ may be determined according to actual needs. The initial opening $K_0$ may have a cross-sectional width $D_0$ in a cross-section perpendicular to the substrate. The cross-sectional width $D_0$ of the initial openings $K_0$ is a minimum achievable width of the used lithography machine.

In one embodiment, the first dielectric layer 13 is, for example, a bottom anti-reflective coating (BARC) layer, and the second dielectric layer 14 is, for example, one or more selected from the group consisting of a low temperature oxide (LTO) layer, a silicon nitride layer, a silicon carbide layer, a titanium nitride layer, a tantalum nitride layer, a titanium oxide layer, and a tantalum oxide layer. The third dielectric layer 15 is, for example, a photoresist layer, which may be patterned by exposure and development procedures to form a pattern having a predetermined shape and an initial openings $K_0$ extending through the photoresist layer. The first dielectric layer 13 may be for example, a bottom anti-reflective coating layer, which can reduce optical reflection during the patterning of the photoresist layer. Alternatively, the third dielectric layer 15 may be one or more selected from the group consisting of a polysilicon layer, a silicon oxide layer, a silicon nitride layer and a silicon carbide layer. The third dielectric layer 15 may be formed by chemical vapor deposition. The initial opening $K_0$ extending through the third dielectric layer 15 can be formed by the procedures of forming a photoresist layer on the third dielectric layer 15; exposing and developing the photoresist layer with a patterned mask to form a patterned photoresist layer, the pattern in the patterned photoresist layer defining the initial opening $K_0$; patterning the third dielectric layer 15 by the etching procedure to form the initial opening $K_0$ with the patterned photoresist layer as a mask; and removing the patterned photoresist layer.

In another embodiment, the first dielectric layer 13 is, for example, a silicon oxide layer, the second dielectric layer 14 being, for example, a silicon nitride layer, the third dielectric layer 15 being, for example, a silicon oxide layer. In this way, an ONO (Oxide-Nitride-Oxide) stack is created. The first dielectric layer 13, the second dielectric layer 14 and the third dielectric layer 15 may be any other suitable combination of materials.

Figure 3:
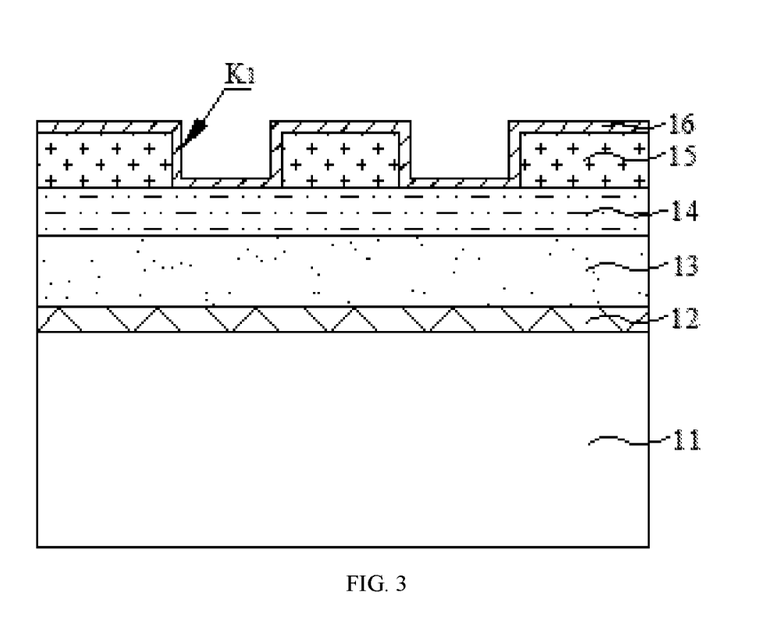
FIG. 3 is a schematic illustration of the method according to an embodiment of present application after the first deposited layer is formed on the structure of FIG. 2.
Figure 4:
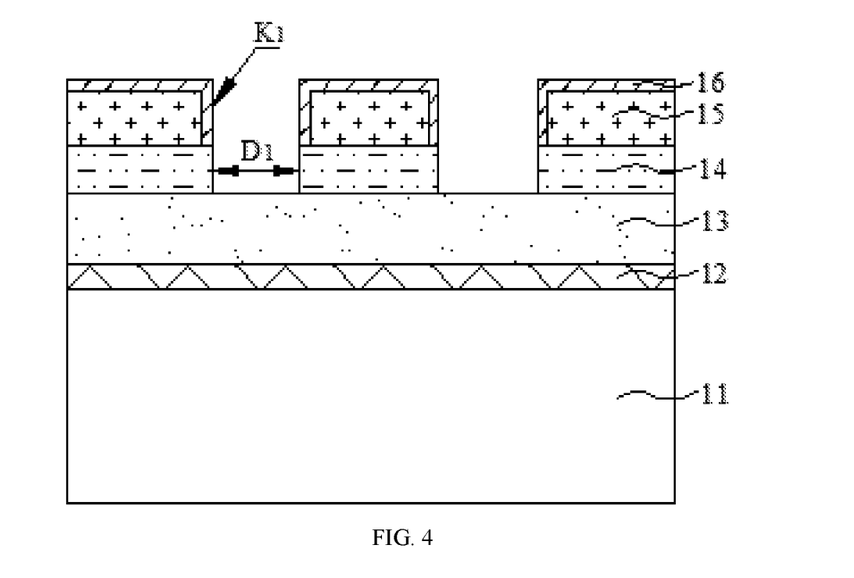
FIG. 4 is a schematic illustration of the method according to an embodiment of present application after the second dielectric layer is etched from the structure of FIG. 3.

As shown in FIGS. 3 and 4, in step S2, the first deposited layer 16 is formed. The first deposited layer 16 covers at least surfaces of the side walls of the initial opening $K_0$, resulting in the formation of the first mask layer having the first opening $K_1$. The first deposited layer 16 having the first opening $K_1$ and the patterned third dielectric layer together constitute the first mask layer. The first opening $K_1$ have a cross-sectional width $D_1$ in a cross-section perpendicular to the substrate. That is, the cross-sectional width $D_1$ refers to the distance between portions of the first deposited layer 16 on opposing side walls of the first opening $K_1$. It should be understood that the opening formed by etching the portion of second dielectric layer 14 to be etched also has a cross-sectional width $D_1$ in the cross-section perpendicular to the substrate. In this step, the formation of the first deposited layer 16 in the initial opening $K_0$ reduces the width $D_1$ of the portion of second dielectric layer 14 to be etched, enabling to narrow the critical dimension (CD) of the final trench. The first deposited layer 16 may further cover the surface of a portion of the second dielectric layer 14 exposed in the initial opening $K_0$.

The first deposited layer 16 may be formed by a deposition procedure using a deposition gas containing $C_4F_8$ at a source power of 800-1200 W and a bias voltage of 250-400 V. The $C_4F_8$-containing deposition gas flows into a plasma processing chamber from a gas source. In one example, the deposition gas is pure $C_4F_8$ provided at a flow rate of 100-500 sccm. In the plasma processing chamber, the deposition gas is transformed to the deposition plasma. The deposition lasts for 30 seconds. Then, the deposition for the first deposited layer 16 is stopped, with the chamber maintained at a pressure of 90-150 mTorr. The deposition lasts preferably for at least 20 seconds, more preferably for at least 25 seconds, most preferably for at least 30 seconds. Preferably, the thickness of the first deposited layer on the side walls of the initial opening is at least 200 nm. More preferably, the thickness of the first deposited layer on the side walls of the initial opening is at least 300 nm.

As shown in FIG. 4, in step S3, the first etching procedure is performed with the first mask layer as a mask to remove the portion of the second dielectric layer 14 directly below the first opening $K_1$, until the side walls of the second dielectric layer 14 are exposed. Specifically, the portion of the second dielectric layer 14 directly below the first opening $K_1$ is etched until the first dielectric layer 13 is exposed. The first etching procedure is performed with an etching gas containing $CF_4$ at a source power of 600-800 W and a bias voltage of 250-400 V.

Figure 5:
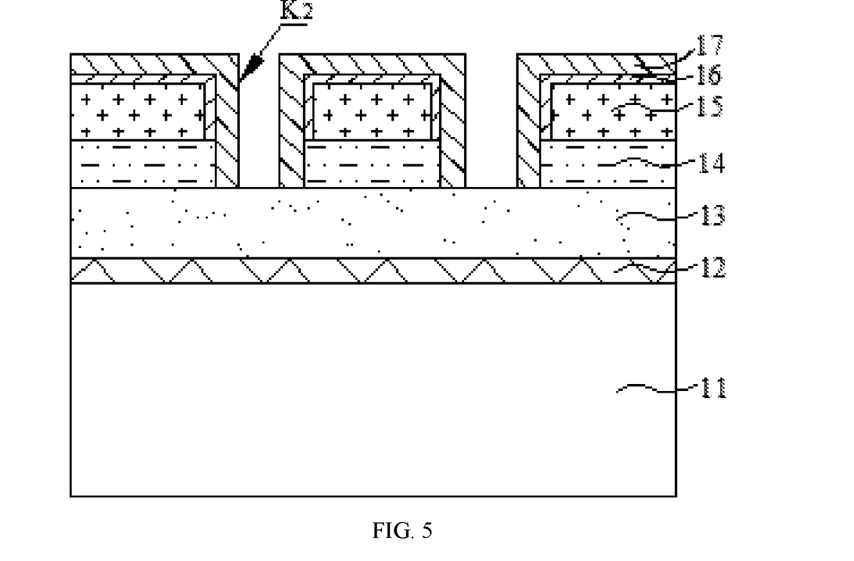
FIG. 5 is a schematic illustration of the method according to an embodiment of present application after the second deposited layer is formed on the structure of FIG. 4.
Figure 6:
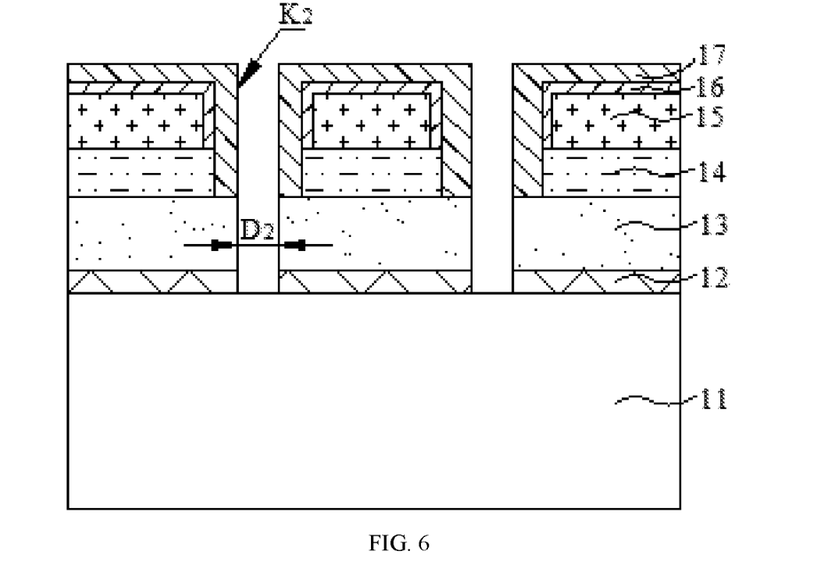
FIG. 6 is a schematic illustration of the method according to an embodiment of present application after the first dielectric layer is etched from the structure of FIG. 5.

As shown in FIGS. 5 and 6, in step S4, the second deposited layer 17 is formed. The second deposited layer 17 covers at least side walls of the first opening $K_1$ and the exposed side walls of the second dielectric layer 14, to form the second mask layer having a second opening $K_2$. Specifically, the second dielectric layer 14, the third dielectric layer 15, the first deposited layer 16 and the second deposited layer 17 together constitutes the second mask layer. In this step, the formation of the second deposited layer 17 enables to reduce the width $D_2$ of the portion of first dielectric layer 13 to be etched, allowing to narrow the critical dimension (CD) of the final trench. More specifically, width $D_2$ refers to the cross-sectional width, in the cross-section perpendicular to the substrate, of the etching opening formed by etching the portion of first dielectric layer 13 to be etched. width $D_2$ is also the cross-sectional width of the second opening $K_2$, being equivalent to the distance between portions of the second deposited layer 17 on opposing side walls of the second opening $K_2$. The second deposited layer 17 may be formed by a deposition procedure using a deposition gas containing $C_4F_8$, a source power of 800-1200 W and a bias voltage of 250-400 V.

Figure 7:
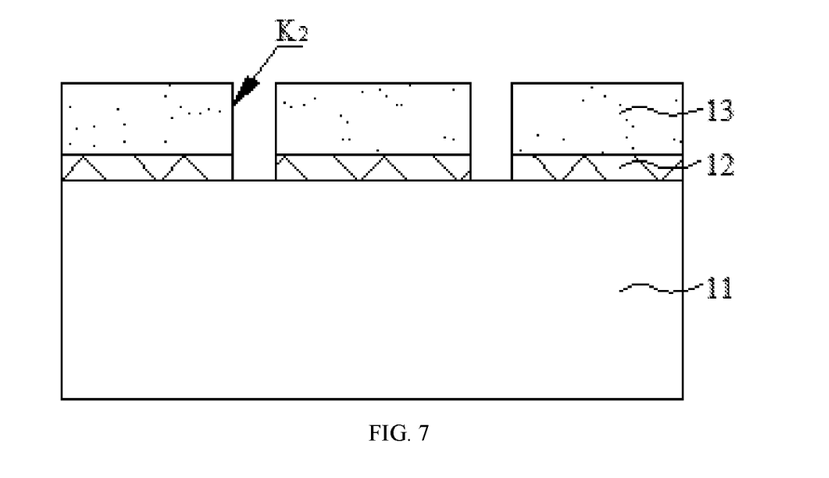
FIG. 7 is a schematic illustration of the method according to an embodiment of present application after the second and third dielectric layers are etched from the structure of FIG. 6.

As shown in FIGS. 6 and 7, in step S5, the second etching procedure is performed with the second mask layer as a mask to remove the portion of the first dielectric layer 13 directly below the first dielectric layer 13, until the substrate 11 is exposed. Specifically, portions of the first dielectric layer 13 and the oxide layer 12 directly below the second opening $K_2$ are etched until the substrate 11 is exposed. The second etching procedure is performed with an etch gas containing CO, $O_2$ and $Ar_2$, at a source power of 800-1500 W and a bias voltage of 200-400 V.

In this embodiment, procedures of forming the first mask layer, performing the first etching procedure, forming the second mask layer and performing the second etching procedure are each accomplished within a same single etching device. Such a process is also called the in-situ etching process. Since the formation procedure of the mask layer and the etching procedure are accomplished in separate devices in prior art, such a in-situ etching process is advantageous in avoiding problems of the increased process procedures and the prolonged process time due to transportations between devices.

As shown in FIGS. 6 and 7, in step S6, the second mask layer is removed, and then the trench V is formed by etching the substrate 11 with the first dielectric layer 13 having the second opening $K_2$ serving as a mask. Removing the second mask layer comprises removing each of the second dielectric layer 14, the third dielectric layer 15, the first deposited layer 16 and the second deposited layer 17. The removal of the second deposited layer 17, the first deposited layer 16 and the third dielectric layer 15 may be accomplished by $O_2$ plasma ashing or stripping solution immersion. The first deposited layer 16 and the second deposited layer 17 may be both organic polymers formed from $C_4F_8$, which can be removed by $O_2$ plasma ashing or stripping solution immersion The $O_2$ plasma ashing may be performed for 60-120 s at a source power of 300-400 W, an $O_2$ flow rate of 300-500 sccm, a pressure of 10-30 mTorr and a temperature of 30-50° C. The stripping solution may be selected as an N-methyl pyrrolidone (NMP) solution, and the immersion in the stripping solution may last for 120-240 s. NMP is an important chemical that can be used as a polar solvent because of its excellent selectivity and good stability. The second dielectric layer 14 may be removed by a wet etching process. In an example, the second dielectric layer 14 is removed by the wet etching process lasting for 20-50 s and using a 2-10 wt % oxalic acid.

Figure 8:
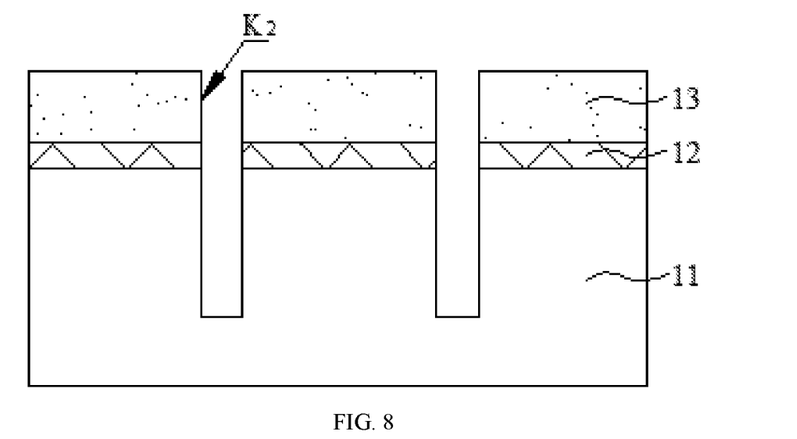
FIG. 8 is a schematic illustration of the method according to an embodiment of present application after the substrate is etched from the structure of FIG. 7.
Figure 9:
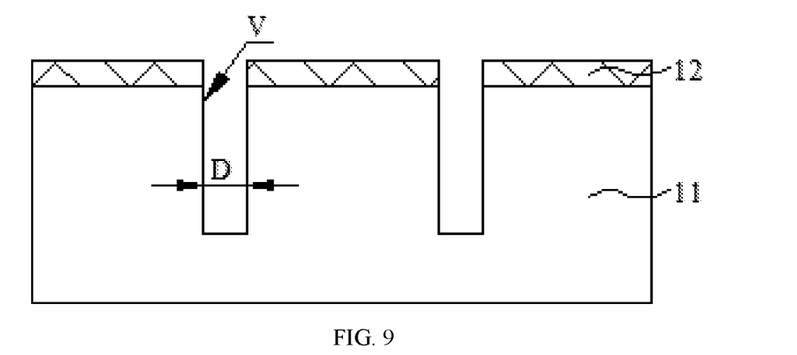
FIG. 9 is a schematic illustration of the method according to an embodiment of present application after the first dielectric layer is removed from the structure of FIG. 8.

As shown in FIGS. 8 and 9, the trench V is formed by etching the substrate 11 with the first dielectric layer 13 having the second opening $K_2$ as a mask. The trench V has a cross-sectional width D in the cross section perpendicular to the substrate, which is approximately equal to the cross-sectional width $D_2$ of the second opening $K_2$, because the occurrence of slight lateral etching during the etching procedure results in the deviation between width D and $D_2$. The cross-sectional width D of the trench V can be considered as the critical dimension (CD) of the trench V. The substrate 11 may be etched by a Bosch process using an etch gas containing $SF_6$ and a passivation gas containing $C_4F_8$. The Bosch process is a process that manages to deposit one layer of film on the lateral side wall to be etched in order to prevent or weaken the lateral etching during the integrated circuit manufacturing. The Bosch process comprises: etching silicon with active fluorine-based groups; passivating the side wall; and alternatively repeating the etching and passivating procedures. By the alternate switch between the etching gas and passivation gas, the etching and passivating procedures can be alternatively performed. The cycle comprising etching procedure and the passivating procedure switch to next cycle every 5~10 s, so that the short period of isotropic etching is followed by the passivation of the freshly etched silicon surface. Passivation layer on the lateral side can be retained as the physical sputtering and bombardment of ions proceeds in the depth-wise direction, so as to prevent lateral etching during the next etch cycle. Through said cyclical process of "etching-passivating-etching", the etching proceeds only in the depth-wise direction and the trench V is eventually formed. The trench V is, for example, a deep trench in which an isolation layer is filled to form the deep trench isolation (DPI). The trench V may have a depth of at least 500 nm, more preferably at least 1000 nm. The trench V may have a depth-to-width ratio of preferably at least 5:1, more preferably at least 10:1.

As an example, in the cycle of etching the substrate 11 to form the trench V, the deposition (passivation) procedure is performed with the deposition gas containing $C_4F_8$ for a period of deposition time of 10-30 s at a source power of 450-600 W, a $C_4F_8$ flow rate of 10-20 sccm, a pressure of 3-10 mTorr, a temperature of 30-50° C. and a bias voltage of 60-100 V. In the Bosch process, $C_4F_8$ is mainly used to form side wall protection polymer to protect the side wall from damage. The etching procedure is performed with the etching gas containing $SF_6$ for a period of etching time of 30-50 s at a source power of 300-400 W, an $SF_6$ flow rate of 30-50 sccm, a pressure of 3-10 mTorr and a temperature of 30-50° C.

As shown in FIG. 9, the first dielectric layer 13 may be removed by a dry etching process. The dry etching process is performed with an etching gas containing CO, $O_2$ and $Ar_2$ at a source power of 800-1500 W and a bias voltage of 200-400 V. At this point, a semiconductor device in which the small-dimension deep trench isolation (DTI) structure is formed in the substrate is obtained. Said semiconductor device can be used to manufacture image sensors and other devices requiring the trench isolation. Said semiconductor device also allows to make more photosensitive elements within the same area, thereby improving the pixel per inch and the imaging quality of the image sensors.

In summary, present application provides a method for manufacturing a semiconductor, comprising: providing a substrate, on which a first dielectric layer, a second dielectric layer and a third dielectric layer are successively formed, the third dielectric layer having an initial opening; forming a first deposited layer which at least covers a surface of a side wall of the initial opening, to form a first mask layer having a first opening; etching the second dielectric layer directly below the first opening to expose a side wall of the second dielectric layer; forming a second deposited layer which at least covers the side wall of the first opening and the exposed side wall of the second dielectric layer, to form a second mask layer having a second opening; etching the first dielectric layer directly below the second opening to expose the substrate; and etching the substrate to form the trench. Present application allows separating the deposition procedure from the etching procedure as well as forming the first deposited layer to narrow the width of the second dielectric layer to be etched and forming the second deposited layer to narrow the width of the first dielectric layer. Such step-wise reduction in width to be etched enables to narrow the critical dimension (CD) of the final trench. In this way, the deep trench isolation (DTI) with a reduced dimension is able to be formed at a low cost, which enables to improve imaging quality.

The embodiments disclosed herein are described in a progressive manner, and the description of each embodiment focuses on its differences from others. Reference can be made between the embodiments for their identical or similar parts. Since the method disclosed in embodiments correspond to the device disclosed in embodiments, they are described relatively brief, and reference can be made to the description of method in embodiments.

While several preferred embodiments of present application has been described above, they are not intended to limit the protection scope of present application in any way. Any person skilled in the art without departing from the spirit and scope of the present application can make possible changes and modifications to the technical solution of present application by using the foregoing methods and technical content. Accordingly, any and all such simple variations, equivalent alternatives and modifications made to the foregoing embodiments without departing from the scope of the present application are intended to fall within the scope thereof.

What is claimed is:

1. A method for manufacturing a semiconductor, comprising:

providing a substrate, on which a first dielectric layer, a second dielectric layer and a third dielectric layer are successively formed, the third dielectric layer having an initial opening;

forming a first deposited layer which at least covers a surface of a side wall of the initial opening, to form a first mask layer having a first opening;

removing the second dielectric layer directly below the first opening to expose a side wall of the second dielectric layer by performing a first etching procedure with the first mask layer as a mask;

forming a second deposited layer which at least covers the side wall of the first opening and the exposed side wall of the second dielectric layer, to form a second mask layer having a second opening;

removing the first dielectric layer directly below the second opening to expose the substrate by performing a second etching procedure with the second mask layer as a mask, thereby transferring the second opening into the etched first dielectric layer; and removing the second mask layer, and forming a trench by etching the substrate with the first dielectric layer having the second opening as a mask.

2. The method according to claim 1, wherein
forming the first mask layer, performing the first etching procedure, forming the second mask layer and performing the second etching procedure are each accomplished within a same etching device.

3. The method according to claim 1, wherein the first deposited layer is formed by using a deposition gas containing $C_4F_8$ at a source power of 800-1200 W, a bias voltage of 250-400 V and a flow rate of the deposition gas of 100-500 sccm.

4. The method according to claim 1, wherein a thickness of the first deposited layer formed on the side wall of the initial opening is greater than or equal to 200 nm.

5. The method according to claim 1, wherein the second dielectric layer directly below the first opening is removed by using an etching gas containing $CF_4$ at a source power of 600-800 W and a bias voltage of 250-400 V.

6. The method according to claim 1, wherein the second deposited layer is formed by using a deposition gas containing $C_4F_8$ at a source power of 800-1200 W, a bias voltage of 250-400 V and a flow rate of the deposition gas of 200-600 sccm.

7. The method according to claim 1, wherein the first dielectric layer directly below the second opening is removed by using an etching gas containing CO, $O_2$ and $Ar_2$ at a source power of 800-1500 W and a bias voltage of 200-400 V.

8. The method according to claim 1, wherein removing the second mask layer comprises removing the second deposited layer, the first deposited layer and the third dielectric layer by $O_2$ plasma ashing or stripping solution immersion; and removing the second dielectric layer by a wet etching process using an oxalic acid solution.

9. The method according to claim 1, wherein etching the substrate comprises alternatively performing an etching procedure and a passivation procedure, wherein the etching procedure is performed with an etch gas containing $SF_6$ and the passivation procedure is performed with a passivation gas containing $C_4F_8$.

10. The method according to claim 9, wherein the passivation procedure is performed with the passivation gas containing $C_4F_8$ for a period of passivation time of 10-30 s at a source power of 450-600 W, a $C_4F_8$ flow rate of 10-20 sccm, a pressure of 3-10 mTorr, a temperature of 30-50° C. and a bias voltage of 60-100 V, and the etching procedure is performed with the etching gas containing $SF_6$ for a period of etching time of 30-50 s at a source power of 300-400 W, an $SF_6$ flow rate of 30-50 sccm, a pressure of 3-10 mTorr and a temperature of 30-50° C.

11. The method according to claim 1, wherein
the first dielectric layer is a bottom anti-reflective coating layer, the second dielectric layer being a low temperature oxide layer, the third dielectric layer being a photoresist layer.

12. The method according to claim 1, wherein the second dielectric layer is one or more selected from the group consisting of a low temperature oxide layer, a silicon nitride layer, a silicon carbide layer, a titanium nitride layer, a tantalum nitride layer, a titanium oxide layer, and a tantalum oxide layer.

13. The method according to claim 1, wherein the third dielectric layer is one or more selected from the group consisting of a polysilicon layer, a silicon oxide layer, a silicon nitride layer and a silicon carbide layer.

14. The method according to claim 1, wherein the first dielectric layer is a silicon oxide layer, the second dielectric layer being a silicon nitride layer, the third dielectric layer being a silicon oxide layer.

15. The method according to claim 8, wherein the stripping solution immersion is performed with an N-methyl pyrrolidone solution for a period of 120-240 s.

16. The method according to claim 8, wherein the wet etching process is performed with an oxalic acid solution at a concentration of 2-15 wt % for a period of 20-50 s.

* * * * *